(12) United States Patent
Inoue

(10) Patent No.: US 7,772,687 B2
(45) Date of Patent: Aug. 10, 2010

(54) MULTIPLE ELECTRONIC COMPONENT CONTAINING SUBSTRATE

(75) Inventor: Akinobu Inoue, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 11/962,749

(22) Filed: Dec. 21, 2007

(65) Prior Publication Data

US 2008/0157329 A1    Jul. 3, 2008

(30) Foreign Application Priority Data

Dec. 26, 2006   (JP) ................. P.2006-348755

(51) Int. Cl.
| | |
|---|---|
| H01L 23/02 | (2006.01) |
| H01L 23/34 | (2006.01) |
| H01L 23/48 | (2006.01) |
| H01L 23/52 | (2006.01) |
| H01L 29/40 | (2006.01) |

(52) U.S. Cl. ............... 257/686; 257/777; 257/723
(58) Field of Classification Search ........... 257/686, 257/685, 687, 777, 779, 723
See application file for complete search history.

(56) References Cited

U.S. PATENT DOCUMENTS

| | | | | | |
|---|---|---|---|---|---|
| 5,384,689 | A | * | 1/1995 | Shen ................... | 361/761 |
| 5,579,207 | A | * | 11/1996 | Hayden et al. ........... | 361/790 |
| 5,736,074 | A | * | 4/1998 | Hayes et al. ............ | 264/6 |
| 6,180,881 | B1 | * | 1/2001 | Isaak ................... | 174/524 |
| 6,501,168 | B1 | * | 12/2002 | Castro et al. ........... | 257/700 |
| 6,518,655 | B2 | * | 2/2003 | Morinaga et al. ......... | 257/678 |
| 6,713,857 | B1 | * | 3/2004 | Tsai ................... | 257/686 |
| 6,774,478 | B2 | * | 8/2004 | Eto et al. ............. | 257/686 |
| 6,849,932 | B2 | * | 2/2005 | Tsai et al. ............ | 257/675 |
| 7,061,120 | B2 | * | 6/2006 | Shin et al. ............ | 257/777 |
| 2001/0008307 | A1 | * | 7/2001 | Shen .................. | 257/723 |
| 2002/0011676 | A1 | * | 1/2002 | Akram et al. .......... | 257/777 |
| 2004/0007771 | A1 | * | 1/2004 | Shin et al. ........... | 257/686 |
| 2004/0041249 | A1 | * | 3/2004 | Tsai et al. ........... | 257/686 |
| 2005/0006784 | A1 | * | 1/2005 | Nakayama ............. | 257/777 |
| 2006/0087020 | A1 | * | 4/2006 | Hirano et al. ......... | 257/686 |
| 2006/0110849 | A1 | * | 5/2006 | Lee et al. ............ | 438/106 |
| 2006/0231939 | A1 | * | 10/2006 | Kawabata et al. ...... | 257/686 |
| 2007/0246813 | A1 | * | 10/2007 | Ong et al. ............ | 257/686 |
| 2007/0278644 | A1 | * | 12/2007 | Hsu et al. ........... | 257/686 |
| 2008/0122079 | A1 | * | 5/2008 | Chen et al. .......... | 257/737 |

FOREIGN PATENT DOCUMENTS

JP    2005-310984    11/2005

* cited by examiner

*Primary Examiner*—Sue Purvis
*Assistant Examiner*—Teresa M Arroyo
(74) *Attorney, Agent, or Firm*—Drinker Biddle & Reath LLP

(57) ABSTRACT

In an electronic component contained substrate in which electronic components are mounted between a pair of wiring substrates in a plural-stage stacked fashion, one wiring substrate and other wiring substrate are connected electrically mutually via solder balls, a first electronic component is mounted on one wiring substrate and then a second electronic component is mounted on the first electronic component, an opening portion for containing the second electronic component therein is provided in the other wiring substrate, the second electronic component is contained and mounted in the opening portion and is connected electrically to the other wiring substrate by a wire bonding, and a space between the pair of wiring substrates is sealed with a sealing resin.

6 Claims, 10 Drawing Sheets

MULTIPLE ELECTRONIC COMPONENT CONTAINING SUBSTRATE

This application claims priority from Japanese Patent Application No. 2006-348755, filed Dec. 26, 2006, in the Japanese Patent Office. The Japanese Patent Application No. 2006-348755 is incorporated by reference in its entirety.

TECHNICAL FIELD

The present disclosure relates to an electronic component contained substrate and, more particularly, an electronic component contained substrate in which a plurality of electronic components are stacked and mounted between a pair of wiring substrates.

RELATED ART

As the electronic component contained substrate that contains the electronic component to put it between two sheets of wiring substrates, the product in a mode shown in FIG. 11 has been proposed (see the paragraph 0073 of Patent Literature 1 (Japanese Patent Unexamined Publication No. 2005-310984), for example). This product is formed by stacking two semiconductor devices 300A, 300B. The semiconductor devices 300A, 300B are connected electrically by joining electrodes 212A, 212B via solder balls 250.

In the semiconductor element 300A, three semiconductor elements 230A, 231A, 232A are mounted on an upper surface of a wiring substrate 200A in a two-stage stacked fashion. Concretely, two semiconductor elements 230A, 231A are mounted on electrodes 218A of the wiring substrate 200A respectively by flip-chip bonding, and the semiconductor element 232A is mounted to cover the back surface side of the semiconductor elements 230A, 231A. The semiconductor element 232A is connected electrically to connection pads 216A of the wiring substrate 200A by the wire bonding. The semiconductor elements 230A, 231A, 232A are sealed with a resin 251.

Also, in the semiconductor element 300B, three semiconductor elements 230B, 231B, 232B are mounted on an upper surface of a wiring substrate 200B in a two-stage stacked fashion. Concretely, two semiconductor elements 230B, 231B are mounted on electrodes 218B of the wiring substrate 200B respectively by flip-chip bonding, and the semiconductor element 232B is mounted to cover the back surface side of the semiconductor elements 230B, 231B. The semiconductor element 232B is connected to a lower surface of the wiring substrate 200A by flip-chip bonding.

When the configuration of the semiconductor element 300A in FIG. 11 is viewed, the lower semiconductor elements 230A, 231A are connected to the wiring substrate 200A by flip-chip bonding and therefore an area into which an underfill resin 280 oozes out is present in outer peripheral portions of the semiconductor elements 230A, 231A respectively. Therefore, when the upper semiconductor element 232A is connected electrically to the connection pads 216A, the connection pads 216A to which a bonding wire 260 is connected respectively must be arranged in areas at least on the outer side than the area into which the underfill resin 280 oozes out. As a result, such a problem exists that a length of the bonding wire 260 becomes longer.

Also, when either a planar dimension of the upper semiconductor element 232A is smaller than those of the lower semiconductor elements 230A, 231A or a mounting area of the upper semiconductor element 232A is smaller than mounting areas of the semiconductor elements 230A, 231A, a length of the bonding wire becomes longer and thus the semiconductor element 232A cannot be directly bonded to the connection pads 216A of the wiring substrate 200A by wire bonding. Therefore, such a configuration must be employed that relaying pads are provided to back surfaces of the lower semiconductor elements 230A, 231A and these pads are connected to the wiring substrate 200A. In such mode, a wire length of the bonding wire is lengthened and also extra processing is required for the wire-bonding connection. As a result, such a problem also exists that a production cost of the electronic component contained substrate adds up.

In this manner, when the electronic components such as the semiconductor elements, or the like are mounted in a plural-stage stacked fashion, such problems arise that a planar dimension (a plane area) of an electronic component contained substrate 400 is increased and a production cost is increased.

SUMMARY

Exemplary embodiments of the present invention provide an electronic component contained substrate containing a plurality of electronic components in a stacked state that can reduce a planar dimension (a plane area) considerably and can be manufactured at a low cost.

The present invention provides an electronic component contained substrate comprising:

a pair of wiring substrates;

a plurality of electronic components which are mounted between the pair of wiring substrates in a stacked fashion, the electronic components including a first electronic component mounted on one wiring substrate and a second electronic component mounted on the first electronic component;

a solder balls which electrically connects the pair of wiring substrates; and a sealing resin which seals a space between the pair of wiring substrates, wherein the other wiring substrate has an opening portion for containing the second electronic component therein, and wherein the second electronic component is mounted so that the second electronic component is contained in the opening portion of the other wiring substrate and is connected electrically to the other wiring substrate by a wire bonding.

The second electronic component may be mounted such that a surface to which the wire bonding is applied is positioned within a thickness of the other wiring substrate. Thus, a height position of the wire-bonding surface of the second electronic component can be lowered with respect to the connection pad of the other wiring substrate. Therefore, in wire-bonding the second electronic component and the other wiring substrate, a top height of a wire loop formed by the bonding wire can be lowered. As a result, a thickness dimension of the electronic component contained substrate can be reduced.

Also, the first electronic component may be coated with the sealing resin, and the second electronic component may be mounted on a surface of the sealing resin. Therefore, the manufacture of the electronic component contained substrate can be facilitated, and thus the inexpensive electronic component contained substrate can be provided.

Also, the second electronic component may be adhered directly to the first electronic component. Therefore, a space between one wiring substrate and the other wiring substrate, the first and second electronic components, and the bonding wires can be sealed all together by the resin. As a result, the number of times of the resin sealing steps can be reduced.

Also, a core contained solder ball that is formed by coating an outer surface of a core material made of a metal, which is shaped into a spherical body, with a solder may be used as the solder ball. It is preferably that the core material may be formed of copper. Therefore, even when a thin wiring substrate is used as one wiring substrate and the other wiring substrate, the electronic component contained substrate having a sufficient mechanical strength can be provided.

According to the electronic component contained substrate according to the present invention, electrode positions of the second electronic component being connected to the other wiring substrate by the wire bonding can be brought closer to the connection pads of the other wiring substrate. Therefore, a length of the bonding wire can be reduced considerably and also the electronic component contained substrate with high electrical reliability can be provided at a low cost.

Other features and advantages may be apparent from the following detailed description, the accompanying drawings and the claims.

DETAILED DESCRIPTION

First Embodiment

Figure 1:
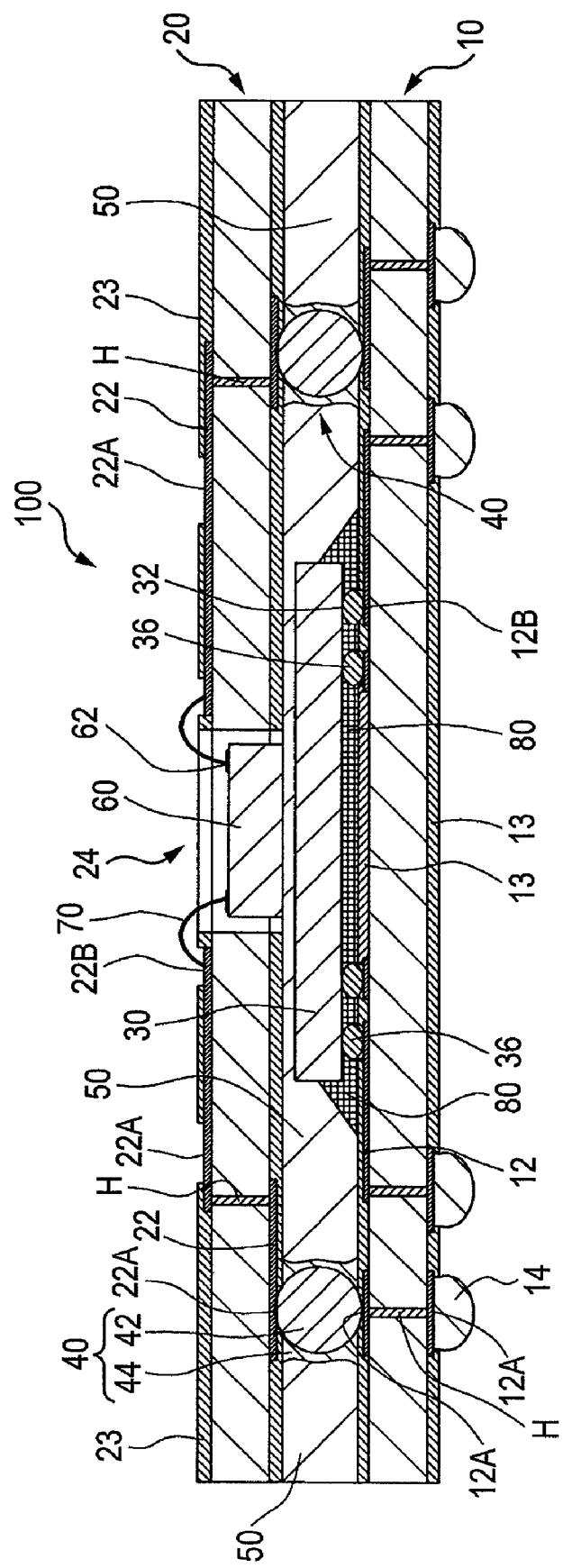
FIG. 1 is a cross sectional view of an electronic component contained substrate in a first embodiment of the present invention.
Figure 2:
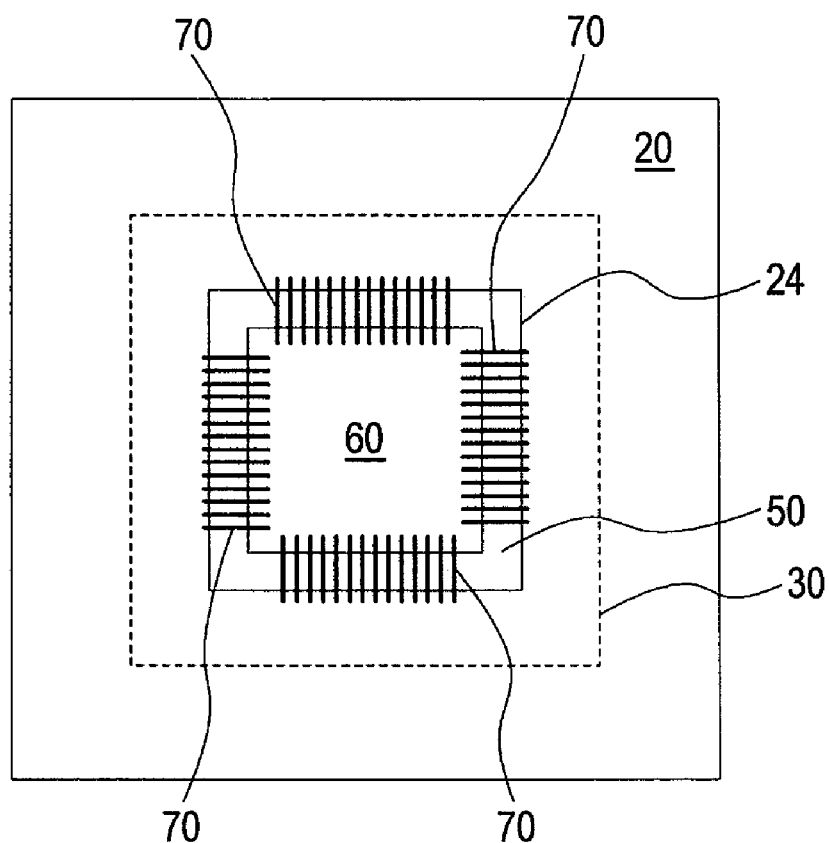
FIG. 2 is a plan view of an opening portion and its neighboring area in the electronic component contained substrate in FIG. 1.
Figure 3:
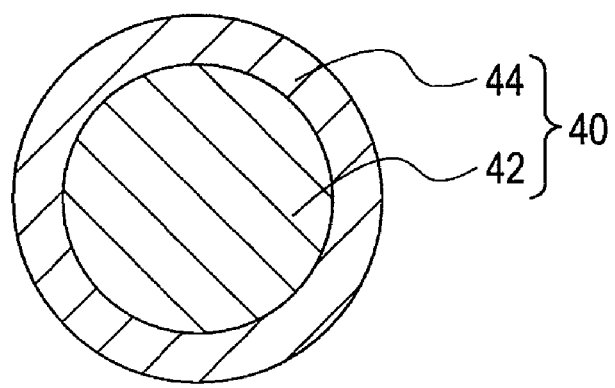
FIG. 3 is a sectional view showing a structure of a solder ball used in the first embodiment.

A first embodiment of an electronic component contained substrate according to the present invention will be explained with reference to the drawings hereinafter. FIG. 1 is a cross sectional view of an electronic component contained substrate in a first embodiment of the present invention. FIG. 2 is a plan view of an opening portion and its neighboring area in the electronic component contained substrate shown in FIG. 1. FIG. 3 is a sectional view showing a structure of a solder ball used in the present embodiment.

In the present embodiment, an electronic component contained substrate 100 is constructed such that a first semiconductor element 30 as a first electronic component is mounted between a pair of wiring substrates (a wiring substrate 10 on a lower layer side and a wiring substrate 20 on an upper layer side) and also a second semiconductor element 60 as a second electronic component is mounted on the first semiconductor element 30. The first semiconductor element 30 is connected electrically to the wiring substrate 10 as one wiring substrate. The second semiconductor element 60 is connected electrically to the wiring substrate 20 as the other wiring substrate. Also, the wiring substrate 10 and the wiring substrate 20 are connected electrically by solder balls 40, and a sealing resin 50 is filled in a space between the wiring substrate 10 and the wiring substrate 20.

A wiring pattern 12 is formed of a conductor such as copper, or the like on upper and lower surfaces of the wiring substrate 10 by the publicly known method respectively. A surface of the wiring substrate 10 is covered with a resist 13, and portions of the wiring pattern 12 to which the connection terminals are connected are exposed as connection pads 12A and connection pads 12B. Also, external connection terminals 14 are joined to the connection pads 12A on the lower surface side of the wiring substrate 10. The external connection terminals 14 joined to the lower surface side of the wiring substrate 10 and the wiring pattern 12 formed on the upper surface side are connected electrically via through holes H.

The first semiconductor element 30 is mounted on the upper surface of the wiring substrate 10. The first semiconductor element 30 is connected to the connection pads 12B of the wiring substrate 10 via bumps 36 such as solder bumps, gold bumps, or the like, which are joined to electrode surfaces 32, by flip-chip bonding. An underfill resin 80 is injected into a space between a lower surface (electrode surface side) of the first semiconductor element 30 and the upper surface of the wiring substrate 10 such that the electrode surfaces 32, the bumps 36, and the connection pads 12B are sealed.

Like the wiring substrate 10, a wiring pattern 22 is formed of the conductor such as copper, or the like on upper and lower surfaces of the wiring substrate 20 by the publicly known method respectively. A surface of the wiring substrate 20 is covered with a resist 23, and portions of the wiring pattern 22 to which the connection terminals are joined and portions to which the wire bonding is applied are exposed as connection pads 22A and the wire-bonding connection pads 12B respectively. The wiring patterns 22 formed on both surfaces of the wiring substrate 20 are connected electrically mutually via the through holes H.

FIG. 2 is a plan view showing the opening portion and its neighboring area in the wiring substrate 20. As shown in FIG. 2, an opening portion 24 is provided to the wiring substrate 20 to pass through the wiring substrate 20 in the thickness direction. The opening portion 24 is provided to open a mounting area of the second semiconductor element 60 as the second electronic component. The opening portion 24 is formed to open more largely than a planar dimension of the second semiconductor element 60.

The wiring substrate 10 and the wiring substrate 20 are connected electrically via the solder balls 40. The connection pads 12A, which are formed on the upper surface side of the wiring substrate 10, and the connection pads 22A, which are formed on the lower surface side of the wiring substrate 20, are provided in the same planar positions. Respective connection pads 12A, 22A are connected electrically mutually via the solder balls 40.

In the present embodiment, as shown in FIG. 3, the copper core contained solder ball 40 formed by coating an outer surface of a copper core 42 with a solder 44 is used as the solder ball 40 that joins the wiring substrate 10 and the wiring substrate 20 mutually. This copper core 42 is formed copper material as a metal and shaped into a solid sphere.

Because the solder ball 40 containing the copper core 42 therein is employed, the wiring substrate 10 and the wiring substrate 20 are connected electrically in such a condition that at least a clearance between the connection pad 12A of the wiring substrate 10 and the connection pads 22A of the wiring substrate 20 can be kept at a clearance that is equivalent to a diameter dimension of the copper core 42.

Also, the sealing resin 50 is filled into a space between the wiring substrate 10 and the wiring substrate 20. Thus, the space between the wiring substrate 10 and the wiring substrate 20 and the back surface of the first semiconductor element 30 are sealed with the sealing resin 50. A height position of the upper surface of the sealing resin 50 is set to the same height position as the lower surface of the wiring substrate 20.

The second semiconductor element 60 is joined and supported onto the sealing resin 50 by using the adhesive. A height position of the upper surface (surface to which the wire bonding is applied) of the second semiconductor element 60 is set lower than the upper surface position of the wiring substrate 20. In other words, the second semiconductor element 60 is mounted such that a height position of its upper surface is positioned within a thickness of the wiring substrate 20 and also its wire-bonded surface is positioned within an area of the opening portion 24.

The electric connection of the second semiconductor element 60 is performed by connecting wire bonding connection pads 22B, which are provided on the upper surface of the wiring substrate 20 as the other wiring substrate, and electrodes 62 formed on the second semiconductor element 60 via bonding wires 70.

Since the opening portion 24 is formed more largely than a planar dimension of the second semiconductor element 60, such opening portion 24 is opened to surround an outer periphery of the second semiconductor element 60. Because the wire bonding connection pads 22B of the wiring substrate 20 are provided closer to the peripheral portion of the opening portion 24, a clearance between the electrodes 62 of the second semiconductor element 60 and the wire bonding connection pads 22B of the wiring substrate 20 can be reduced. Accordingly, the electrodes 62 and the wire bonding connection pads 22B can be connected easily by the bonding wires 70. In this manner, because the wire bonding connection pads 22B are provided closer to the second semiconductor element 60, a planar dimension (a plane area) of the electronic component contained substrate 100 can be reduced and also reliability of the electrical connection between the second semiconductor element 60 and the wiring substrate 20 can be improved.

Also, in case a planar dimension of the second semiconductor element 60 is considerably smaller than the first semiconductor element 30, the second semiconductor element 60 and the wiring substrate 20 can be connected simply by providing the opening portion 24 in the planar area of the first semiconductor element 30. Thus, there is no need to provide the pads that are used to relay the bonding wires 70. Also, in case a gold wire is used as the bonding wire 70, an amount of used gold can be reduced. Therefore, the electronic component contained substrate 100 can be provided at a low cost.

Next, a method of manufacturing the electronic component contained substrate 100 in the first embodiment will be explained hereunder. FIG. 4 to FIG. 8 are explanatory views showing a state in each step in the steps of manufacturing the electronic component contained substrate respectively. In this case, as the method of forming the wiring patterns on the wiring substrate 10 and the wiring substrate 20, the method of forming the coating of the resists 13, 23, the method of exposing the connection pads 12A, 12B, 22A and the wire bonding connection pads 22B, and the like, the publicly known methods can be employed respectively. Therefore, their detailed explanation will be omitted herein.

Figure 4:
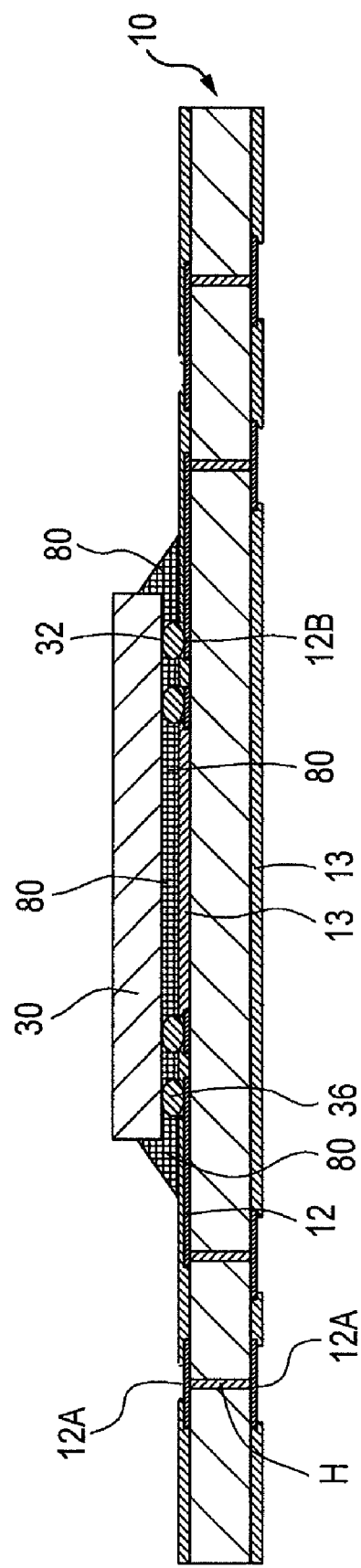
FIG. 4 is an explanatory view showing an in-progress state of the steps of manufacturing the electronic component contained substrate.

First, as shown in FIG. 4, the first semiconductor element 30 as the first electronic component is mounted on the wiring substrate 10 as one wiring substrate. The bumps 36 such as the solder bumps, the gold bumps, or the like are fitted to the electrode surfaces 32 of the first semiconductor element 30. The first semiconductor element 30 is mounted on the wiring substrate 10 by flip-chip bonding while aligning the bumps 36 with the connection pads 12B formed on the upper surface of the wiring substrate 10. After the first semiconductor element 30 is mounted on the wiring substrate 10 by flip-chip bonding, the underfill resin 80 is injected into a space between the first semiconductor element 30 and the upper surface of the wiring substrate 10.

Figure 5:
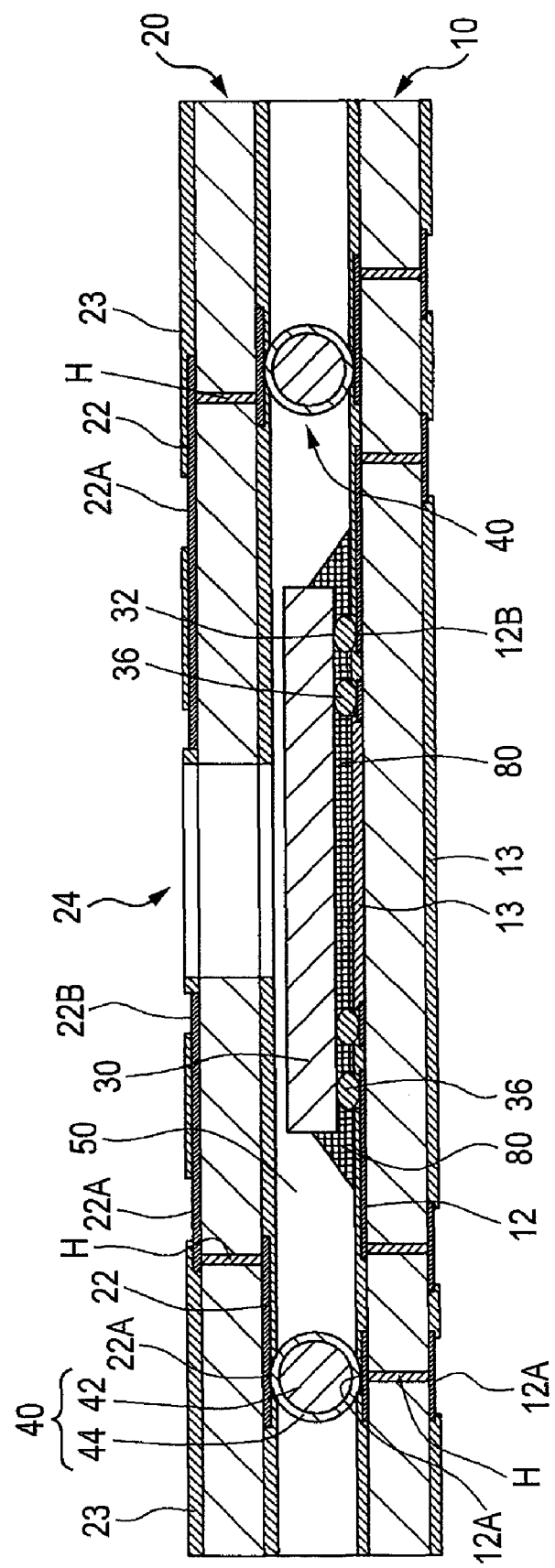
FIG. 5 is an explanatory view showing an in-progress state of the steps of manufacturing the electronic component contained substrate.

After the underfill resin 80 is injected, as shown in FIG. 5, the wiring substrate 20 to the connection pad 22A of which the solder balls 40 are joined is aligned with the wiring substrate 10 and stacked thereon. After the wiring substrate 20 is stacked on the wiring substrate 10 in this way, the wiring substrate 20 is joined to the wiring substrate 10 by reflowing the solder balls 40 by means of the reflowing step. Thus, a state shown in FIG. 6 is given.

Figure 6:
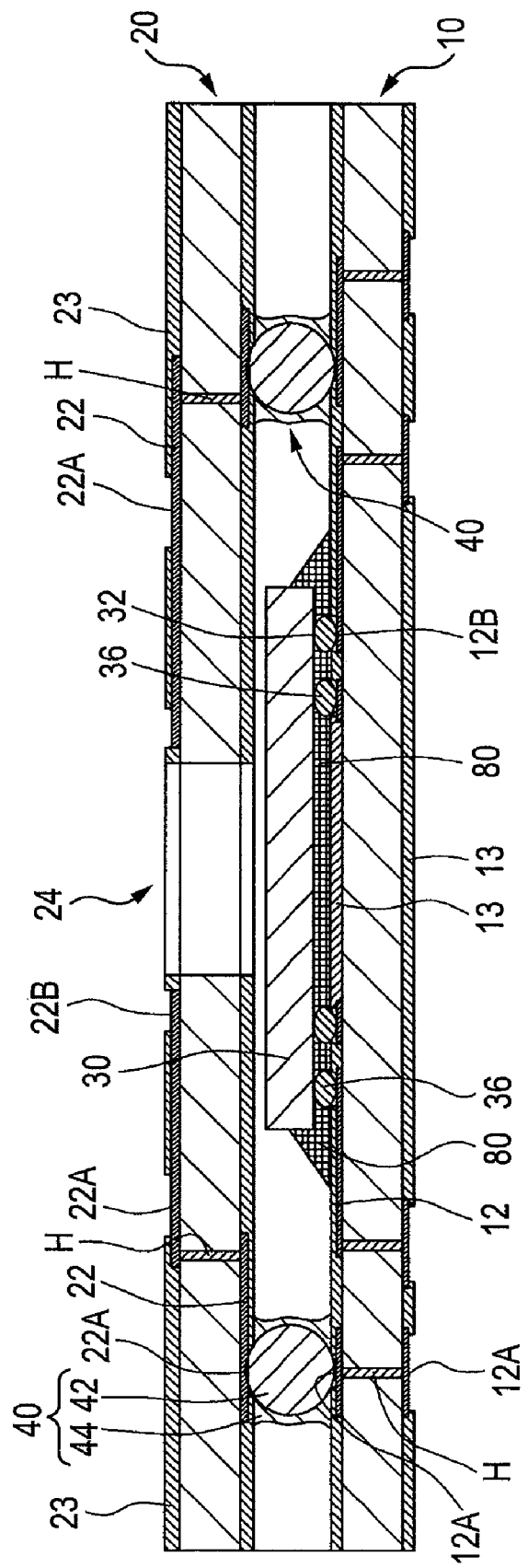
FIG. 6 is an explanatory view showing an in-progress state of the steps of manufacturing the electronic component contained substrate.

As shown in FIG. 6, when the solder balls 40 are subjected to the reflowing step, the solder 44 for covering the outer periphery of the copper core 42 is fused. Thus, the connection pads 12A of the wiring substrate 10 and the connection pads 22A of the wiring substrate 20 can be connected electrically mutually by the solder 44 and the copper core 42, and also a clearance between the wiring substrates 10, 20 can be kept by the copper cores 42 that act as the stopper.

Figure 7:
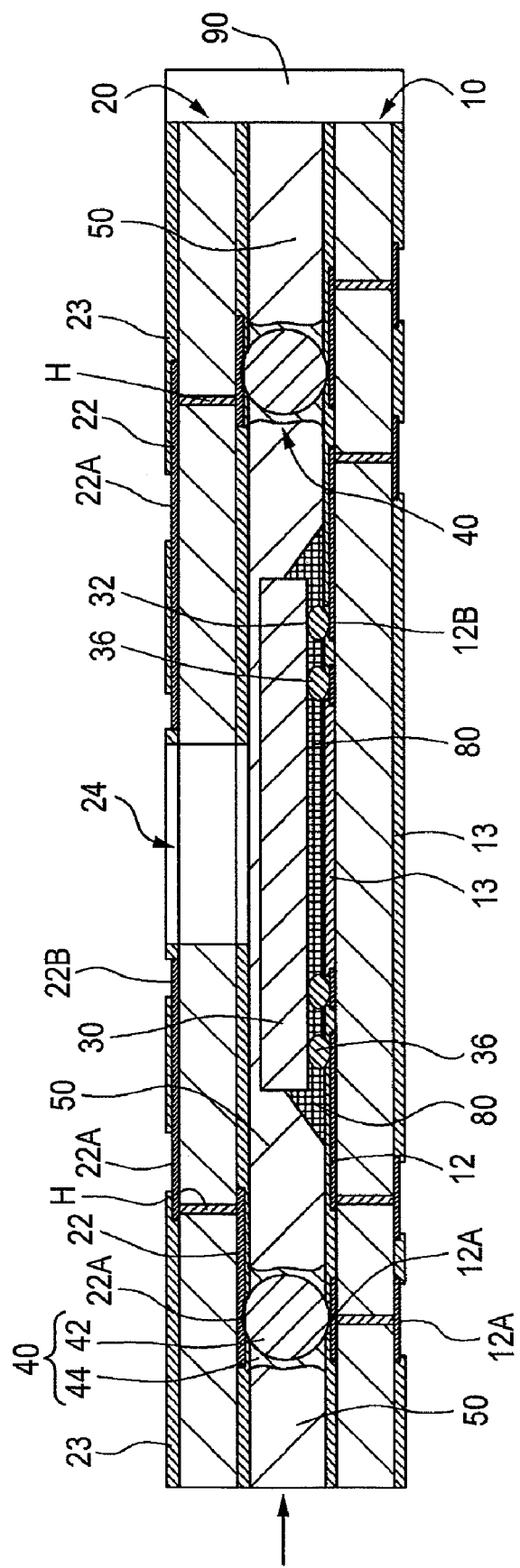
FIG. 7 is an explanatory view showing an in-progress state of the steps of manufacturing the electronic component contained substrate.

After the reflow of the solder balls 40 is completed, the structure is rinsed by the flux, and then the sealing resin 50 is filled into a space between the wiring substrate 10 and the wiring substrate 20 (FIG. 7).

As the method of filling the sealing resin 50 into a space between the wiring substrates 10, 20, for example, as shown in FIG. 7, there is the method of covering side surfaces of the wiring substrate 10 and the wiring substrate 20 on one side with a dam 90 and then injecting the liquid sealing resin 50 into a space between the wiring substrate 10 and the wiring substrate 20 from the side surface of the wiring substrate 10 and the wiring substrate 20 on the other side. The liquid sealing resin 50 is injected into a space between the wiring substrate 10 and the wiring substrate 20 by means of a capillary phenomenon. The sealing resin 50 being injected is cured by a heating.

Then, the dam is removed after the sealing resin 50 is thermally cured. Then, the second semiconductor element 60 as the second electronic component is adhered to the surface of the sealing resin in the opening portion 24 by the adhesive, or the like. Then, the electrodes 62, which are provided on the upper surface of the second semiconductor element 60, and the wire bonding connection pads 22B, which are provided on the upper surface of the wiring substrate 20 as the other wiring substrate, are bonded via the bonding wire 70 such as the gold wire, or the like respectively.

Finally, the external connection terminals 14 such as the solder balls, or the like are joined to the connection pads 12A on the lower surface of the wiring substrate 10.

Figure 8:
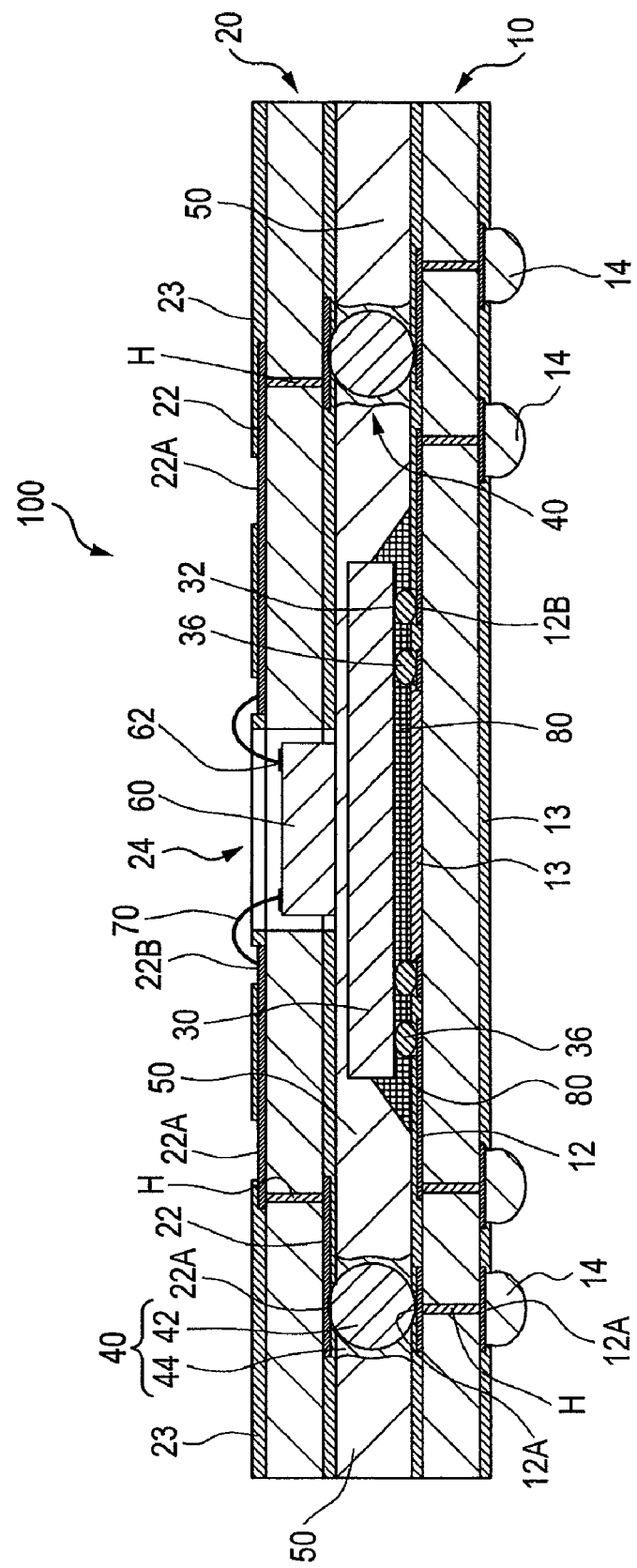
FIG. 8 is a cross sectional view showing the electronic component contained substrate in which a resin is filled in a space between the substrates and two semiconductor elements mounted between the substrates are connected electrically to separate substrates respectively.

With the above, the electronic component contained substrate 100 according to the present embodiment can be formed. FIG. 8 is a cross sectional view showing the electronic component contained substrate in which a resin is filled in a space between the wiring substrates explained in the present manufacturing method and two semiconductor elements mounted between the substrates are connected electrically to separate substrates respectively.

In the explanation of the present manufacturing method, one electronic component contained substrate 100 is illustrated and explained. However, in the actual manufacturing method, a plurality of electronic component contained substrates 100, 100, ..., 100 are resin sealed simultaneously by using a large-size wiring substrate 10 and a large-size wiring substrate 20, and then they are cut along individual outer shapes of the substrates and are divided into individual pieces.

As described above, in the electronic component contained substrate 100 according to the present embodiment, out of two semiconductor elements 30, 60 that are put between the wiring substrate 10 and the wiring substrate 20, the second semiconductor element 60 mounted on the upper side is contained in the opening portion 24 in the wiring substrate 20. Therefore, the electrodes 62 of the second semiconductor element 60 can be mounted in close vicinity of the connection pads 22B of the wiring substrate 20 irrespective of a size of the first semiconductor element 30.

With this configuration, a length of the bonding wire 70 used to connect the electrode 62 of the second semiconductor element 60 and the wire bonding connection pad 22B of the wiring substrate 20 can be shortened. As a result, the electronic component contained substrate 100 can be miniaturized and also reliability of the electrical connection can be improved. In addition, the electronic component contained substrate 100 can be manufactured at a low cost.

Figure 9:
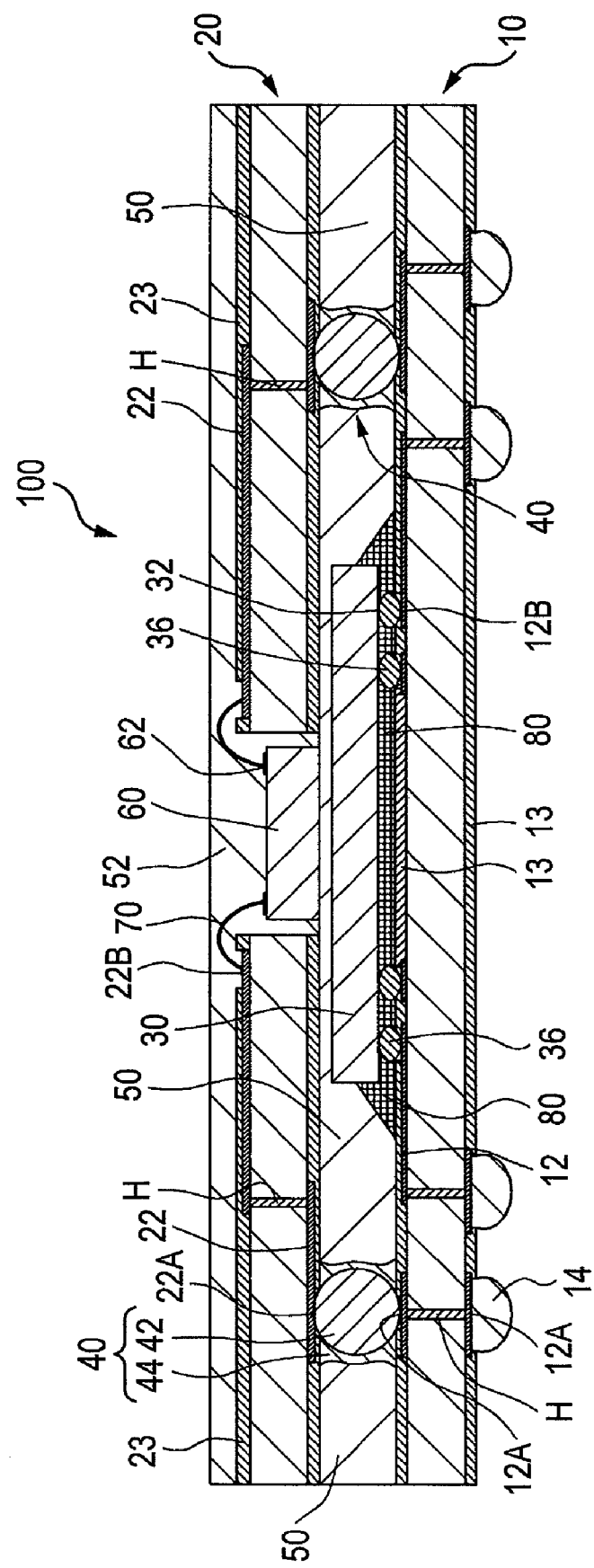
FIG. 9 is a cross sectional view showing a state that an overall surface of a wiring substrate on an upper layer side which contains a second semiconductor element is sealed with a resin from the state shown in FIG. 8.

FIG. 9 is a cross sectional view showing a state that the overall surface of the wiring substrate 20 containing the second semiconductor element 60 is sealed with a resin from the state shown in FIG. 8.

Second Embodiment

Figure 10:
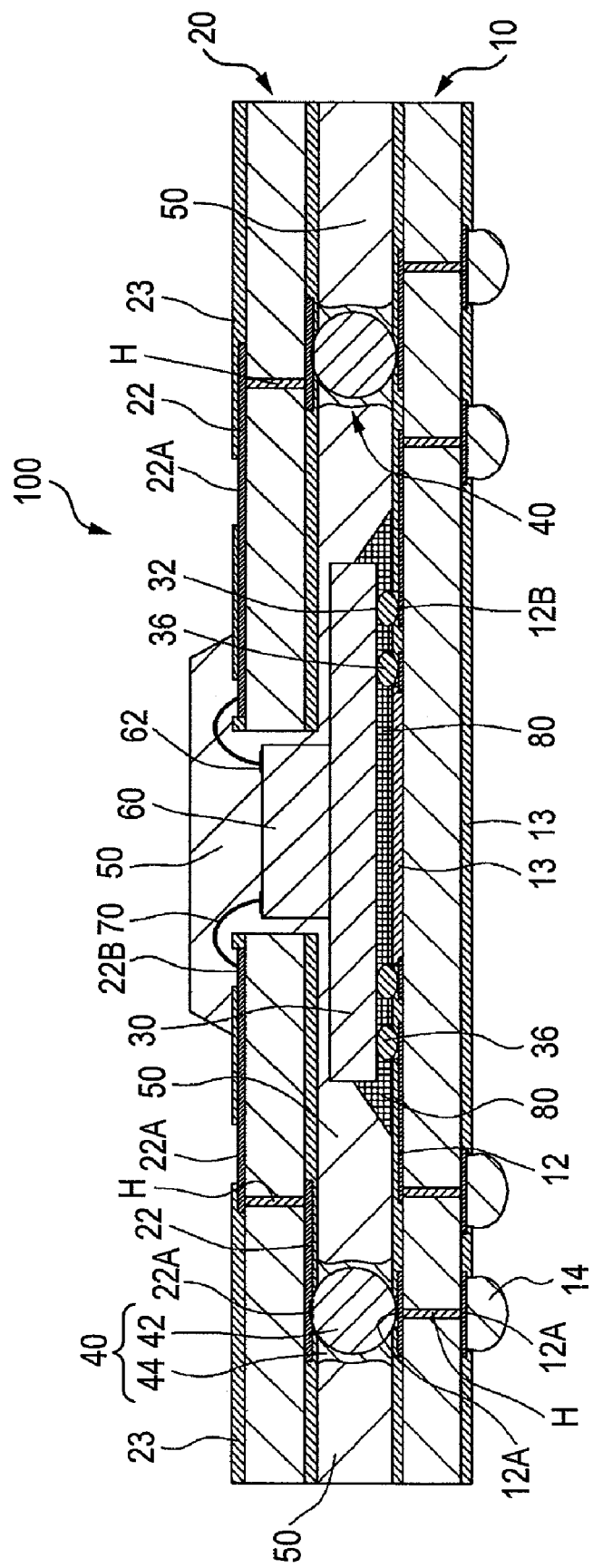
FIG. 10 is a cross sectional view showing a structure of an electronic component contained substrate in a second embodiment of the present invention.
Figure 11:
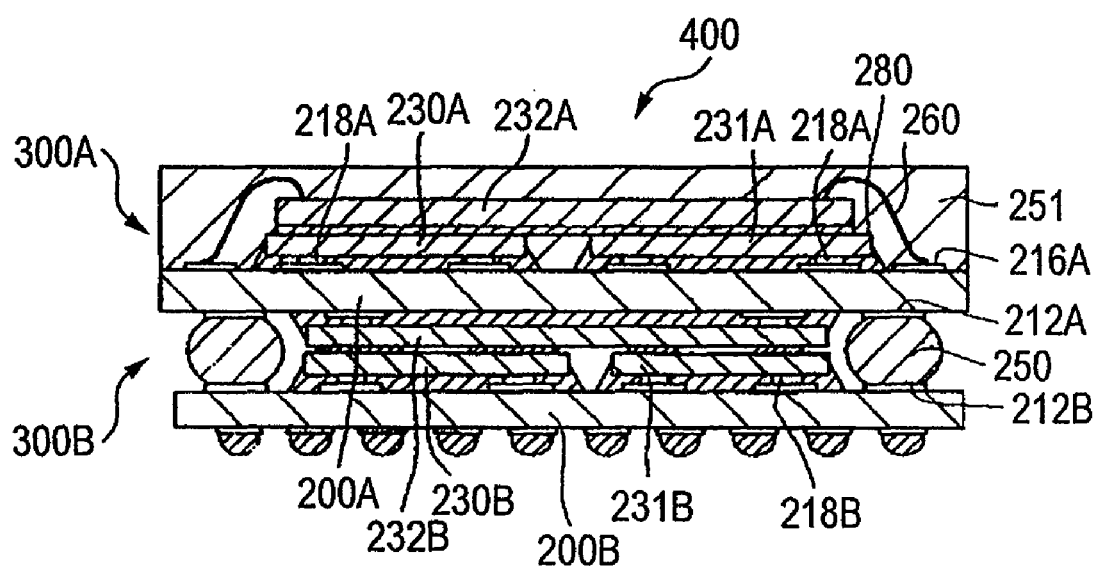
FIG. 11 is an explanatory view of an electronic component contained substrate in the prior art.

FIG. 10 is a cross sectional view showing a structure of an electronic component contained substrate in a second embodiment of the present invention. Concretely, the electronic component contained substrate 100 is constructed by mounting the second semiconductor element 60 directly on the back surface side of the first semiconductor element 30.

In the present embodiment, in the step applied just before the sealing resin 50 is filled into a space between the wiring substrate 10 and the wiring substrate 20 (i.e., in the state that the wiring substrate 20 is joined to the wiring substrate 10 via the solder balls), if the wiring substrate 20 has a mechanical strength enough to withstand the wire bonding operation between the second semiconductor element 60 and the wiring substrate 20, the wiring substrate 10, the wiring substrate 20, and the second semiconductor element 60 can be sealed all together with the sealing resin 50 after the second semiconductor element 60 and the wire bonding connection pads 22B of the wiring substrate 20 are connected by the wire bonding.

In contrast, if a mechanical strength of the wiring substrate 10 and the wiring substrate 20 is not enough, such a mode may be employed that the sealing resin 50 is filled into a space between the wiring substrate 10 and the wiring substrate 20 and then thermally cured, then the wire bonding is applied, and then the second semiconductor element 60 and the wire bonding portions between the second semiconductor element 60 and the wiring substrate 20 is sealed with the sealing resin 50 separately.

As shown in FIG. 10, when the area of the wiring substrate 20 on which the second semiconductor element 60 is mounted is sealed with the sealing resin 50, a circuit component (not shown) such as a chip capacitor, a chip resistor, or the like can be mounted on other areas of the wiring substrate 20.

With the above, the electronic component contained substrate (semiconductor device) 100 according to the present invention will be explained in detail based on the embodiment. But the present invention of this application is not limited to the above embodiment. It is needless to say that various variations and modifications made in a range not to change a gist of the present invention should belong to the technical scope of the present invention of this application.

For example, in the above embodiment, explanation is made by using the semiconductor elements as the first electronic component 30 and the second electronic component 60 respectively. But the first electronic component 30 and the second electronic component 60 are not limited to the semiconductor element, and other electronic component may be employed.

Also, in the present embodiment, the mode in which the first electronic component 30 and the second electronic component 60 are mounted singly respectively is explained. In this case, the first electronic component 30 denotes the electronic component that is mounted on the lower side out of the electronic components being stacked vertically in two stages whereas the second electronic component 60 denotes the electronic component that is mounted on the first electronic component 30. The electronic component contained substrate 100 in which either or both of the first electronic component 30 and the second electronic component 60 are mounted in plural can be constructed.

The solder ball 40 employs the copper core 42 as the core material. But the solder ball 40 whose copper core 42 is formed of any substance except copper may be employed if such substance is a conductor having a softening temperature that is sufficiently higher than a melting point of the solder.

Further, the first semiconductor element 30 may be mounted on the wiring substrate 10 by the wire bonding in place of the flip-chip bonding.

Also, in the above embodiment, the manufacturing method of employing the liquid resin as the sealing resin 50 filled into a space between the wiring substrate 10 and the wiring substrate 20 and then injecting the liquid sealing resin 50 into a space between the wiring substrate 10 and the wiring substrate 20 is explained. Other filling mode may be employed to fill the liquid sealing resin 50 into a space between the wiring substrate 10 and the wiring substrate 20.

For example, the transfer molding may be employed while using an upper mold and a lower mold that clamp the wiring substrate 10 and the wiring substrate 20 from the lower surface side of the wiring substrate 10 and the upper surface side of the wiring substrate 20 respectively, and then the sealing resin 50 may be filled into a space between the wiring substrate 10 and the wiring substrate 20 from a gate of the transfer molding. In this case, an insert die portion may be provided to the upper mold in the position corresponding to the opening portion 24 such that the sealing resin 50 does not enter into the opening portion 24.

What is claimed is:

1. An electronic component containing substrate comprising:
   first and second wiring substrates;
   a plurality of electronic components which are mounted in a stacked fashion, the electronic components including a first electronic component mounted on a top surface of the first wiring substrate and a second electronic component mounted on the first electronic component;
   a plurality of solder balls which electrically connect the first and second wiring substrates and separate the first and second wiring substrates to provide a space for the first electronic component; and
   a sealing resin which fills and seals the space between the first and second wiring substrates for the first electronic component such that the sealing resin seals the first electronic component and the plurality of solder balls,
   wherein the second wiring substrate has an opening portion extending through the second wiring substrate from a top surface thereof to a bottom surface thereof for containing the second electronic component therein, and
   wherein the second electronic component is contained in the opening portion of the second wiring substrate such that an outer periphery of the second electronic component is surrounded by the opening portion, and the second electronic component is connected electrically to the top surface of the second wiring substrate by a wire bonding.

2. An electronic component containing substrate according to claim 1, wherein the second electronic component is mounted such that a height position of the surface to which the wire bonding is applied is positioned lower than the top surface of the second wiring substrate.

3. An electronic component containing substrate according to claim 1, wherein the first electronic component is coated with the sealing resin, and the second electronic component is mounted on a surface of the sealing resin.

4. An electronic component containing substrate according to claim 1, wherein the second electronic component is adhered directly to the first electronic component.

5. An electronic component containing substrate according to claim 1, wherein the solder ball is a core contained solder ball that is formed by coating an outer surface of a core material made of a metal, which is shaped into a spherical body, with a solder.

6. An electronic component containing substrate according to claim 5, wherein the core material is formed of copper.

* * * * *